United States Patent
Cao et al.

(10) Patent No.: US 10,423,039 B2
(45) Date of Patent: Sep. 24, 2019

(54) ARRAY SUBSTRATE AND MANUFACTURING METHOD THEREOF

(71) Applicant: Shenzhen China Star Optoelectronics Semiconductor Display Technology Co., Ltd., Shenzhen (CN)

(72) Inventors: Wu Cao, Shenzhen (CN); Minggang Liu, Shenzhen (CN); Zhuming Deng, Shenzhen (CN); Yunglun Lin, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/392,630

(22) Filed: Apr. 24, 2019

(65) Prior Publication Data
US 2019/0250474 A1 Aug. 15, 2019

Related U.S. Application Data

(62) Division of application No. 15/578,253, filed on Nov. 30, 2017, now Pat. No. 10,330,997.

(30) Foreign Application Priority Data

Sep. 8, 2017 (CN) .......................... 2017 1 0807260

(51) Int. Cl.
*G02F 1/1362* (2006.01)
*H01L 27/12* (2006.01)
(Continued)

(52) U.S. Cl.
CPC .... *G02F 1/136209* (2013.01); *G02F 1/13394* (2013.01); *G02F 1/133345* (2013.01);
(Continued)

(58) Field of Classification Search
CPC ... H01L 27/12; H01L 27/124; H01L 27/1248; H01L 27/1262; H01L 27/13;
(Continued)

(56) References Cited

U.S. PATENT DOCUMENTS

2007/0268243 A1* 11/2007 Choo et al. ....... G02F 1/133512
345/104
2017/0045773 A1* 2/2017 Seo et al. ............ G02F 1/13338

* cited by examiner

*Primary Examiner* — Thinh T Nguyen
(74) *Attorney, Agent, or Firm* — Leong C. Lei

(57) ABSTRACT

The present invention provides an array substrate and a manufacturing method thereof. The array substrate includes: a backing plate, a TFT layer arranged on the backing plate, a protective layer covering the backing plate and the TFT layer, a color resist layer arranged on the protective layer, an organic planarization layer set on and covering the color resist layer and the protective layer, and a BPS light-shielding layer arranged on the organic planarization layer. The BPS light-shielding layer includes: a black matrix and a main photo spacer and a sub photo spacer arranged on the black matrix. The organic planarization layer is formed with a first recess in an area thereof that corresponds to at least a part of the black matrix and the first recess is filled up with the black matrix. By forming the first recess in the organic planarization layer and filling the first recess with the black matrix, the extent by which the black matrix projects beyond a pixel area can be reduced to prevent the black matrix from forming a barrier wall between sub-pixels that affects flowability of liquid crystal and to ensure the quality of a liquid crystal boxing process and the displaying performance of a device.

3 Claims, 6 Drawing Sheets

(51) Int. Cl.
*G02F 1/1333* (2006.01)
*G02F 1/1339* (2006.01)
*G02F 1/1368* (2006.01)

(52) U.S. Cl.
CPC ...... *G02F 1/136286* (2013.01); *H01L 27/124* (2013.01); *H01L 27/1248* (2013.01); *H01L 27/1262* (2013.01); *G02F 1/1368* (2013.01); *G02F 2001/13398* (2013.01); *G02F 2001/136222* (2013.01)

(58) Field of Classification Search
CPC ............. H01L 29/4908; H01L 21/7682; H01L 29/78675; G02F 1/13394
USPC ........... 257/59, 72, 79, 81; 438/48, 128, 151
See application file for complete search history.

ARRAY SUBSTRATE AND MANUFACTURING METHOD THEREOF

CROSS REFERENCE TO RELATED APPLICATIONS

This is a divisional application of co-pending U.S. patent application Ser. No. 15/578,253, filed on Nov. 30, 2017, which is a national stage of PCT Application No. PCT/CN2017/111071, filed on Nov. 15, 2017, claiming foreign priority of Chinese Patent Application No. 201710807260.3, filed on Sep. 8, 2017.

BACKGROUND OF THE INVENTION

1. Field of the Invention

The present invention relates to the field of display technology, and more particular to an array substrate and a manufacturing method thereof.

2. The Related Arts

Liquid crystal display (LCD) is the most widely used product in the market and involves extremely mature techniques of production, high yield rate of products, and relatively low production cost, so as to be widely accepted by the market.

Most of the liquid crystal displays that are currently available in the market are backlighting liquid crystal display devices, which comprise a liquid crystal display panel and a backlight module. The liquid crystal display panel is generally made up of a color filter (CF) substrate, an array substrate, and liquid crystal and sealant sandwiched between the CF substrate and the array substrate, wherein the CF substrate generally comprises a color filter layer that forms color light by means of color resist units (red, green, and blue; R/G/B), a black matrix (BM) that prevents light leaking at edges of pixels, and photo spacers (PS) that helps maintain cell thickness. In a large-scale liquid crystal display panel, there are often at least two types of photo spacers used, such as main photo spacers and sub photo spacers having different heights and arranged on the CF substrate to provide a cushioning function for preventing occurrence of various sorts of mura of defects.

Color-filter On Array (COA) technology is a technique in which the color filter layer on the array substrate. No position alignment error between the CF substrate and the array substrate in a display panel having a COA structure and thus, the difficulty of a boxing process in the production of display panels can be lowered so as to eliminate the error of boxing and the black matrix is allowed to adopt a design involving reduced line width, making it possible to increase aperture ratio. However, pursuing bettered image displaying performance for viewing, such as curved displays, as well as even more cost-reduced display panels are a forever goal of research for technical researchers. Black Photo Spacer (BPS) materials are a new type of materials, which possesses the characteristics of the traditional photo spacer materials, such as excellent elastic restoration capability and low contamination to liquid crystal, and also shows high a relatively high optical density (OD) value to provide an effect of light shielding and thus serve as a black matrix. BM-less technology is a new technique that, on the basis of the COA technology, combines BM and PS together by using the same BPS material with one single production process to be formed on the array substrate, and compared to the traditional liquid crystal display technology, the black matrix, the main photo spacers, the sub photo spacers, and the color filter are all arranged on the array-substrate-side. This not only eliminates light leaking resulting from errors of lamination accuracy occurring in a lamination process or positional shift caused by panel curving occurring in curved display technology, but, more importantly, also help save material and operation for one round of process to thereby shorten the tact time and lower down product cost.

On the other hand, to overcome terrain flatness issues of COA array substrates and also to reduce bubbles, the known techniques involve covering an organic planarization layer on the color resist layer of the COA array substrates, and then forming a BPS layer that includes main photo spacers, sub photo spacers, and a black matrix on the organic planarization layer. In order to provide height differences among the main photo spacers, the sub photo spacers, and the black matrix and to ensure desired heights of the main photo spacers and the sub photo spacers, the BPS layer is often made in a thickness that is relatively large. Under the condition of forming a black matrix after the organic planarization layer has been already formed, it readily results in the black matrix projecting too much beyond a pixel zone and forming a barrier wall between sub-pixels, blocking the flow of liquid crystal and leading to poor displaying.

SUMMARY OF THE INVENTION

Objectives of the present invention are to provide an array substrate encapsulation structure, which helps reduce the extent by which a black matrix projects beyond a pixel zone to ensure flowability of liquid crystal and preventing poor displaying.

Objectives of the present invention are also to provide a manufacturing method of an array substrate, which helps reduce the extent by which a black matrix projects beyond a pixel zone to ensure flowability of liquid crystal and preventing poor displaying.

To achieve the above objectives, the present invention provides an array substrate, which comprises: a backing plate, a thin-film transistor (TFT) layer arranged on the backing plate, a protective layer covering the backing plate and the TFT layer, a color resist layer arranged on the protective layer, an organic planarization layer set on and covering the color resist layer and the protective layer, and a black-photo-spacer (BPS) light-shielding layer arranged on the organic planarization layer;

wherein the BPS light-shielding layer comprises: a black matrix and a main photo spacer and a sub photo spacer arranged on the black matrix, wherein the organic planarization layer is formed with a first recess in an area thereof that corresponds to at least a part of the black matrix and the first recess is filled up with the black matrix.

The color resist layer is formed with a second recess in an area thereof that corresponds to the first recess and the second recess is also filled up with the black matrix.

The TFT layer comprises: a plurality of scan lines that are parallel with and spaced from each other, a plurality of data lines that are parallel with and spaced from each other and are substantially perpendicular to the scan lines, and a plurality of TFTs arranged in an array.

The first recess is formed in a location above the data lines or the scan lines or above both the data lines and the scan lines.

The color resist layer comprises a first lining section and a second lining section, wherein the first lining section has a thickness that is greater than that of the second lining section and the main photo spacer and the sub photo spacer are respectively located above and corresponding to the first lining section and the second lining section.

The present invention also provides a manufacturing method of an array substrate, which comprises the following steps:

Step S1: providing a backing plate and forming a TFT layer on the backing plate;

Step S2: covering the backing plate and the TFT layer with a protective layer and forming a color resist layer on the protective layer;

Step S3: forming an organic film on the color resist layer and conducting a photo mask based operation to pattern the organic film so as to form an organic planarization layer and a first recess that is formed in the organic planarization layer; and Step S4: coating a BPS material on the organic planarization layer and patterning the BPS material to form a black matrix and a main photo spacer and a sub photo spacer arranged on the black matrix, wherein at least a portion of the black matrix is located in an area corresponding to the first recess and fills up the first recess.

Step S2 further comprises: forming a second recess in the color resist layer and in Step S3, the first recess is formed in an area that corresponds to the second recess.

In Step S1, the TFT layer comprises: a plurality of scan lines that are parallel with and spaced from each other, a plurality of data lines that are parallel with and spaced from each other and are substantially perpendicular to the scan lines, and a plurality of TFTs arranged in an array.

The first recess is formed in a location above the data lines or above the scan lines or above both the data lines and the scan lines.

The color resist layer comprises a first lining section and a second lining section, wherein the first lining section has a thickness that is greater than that of the second lining section and the main photo spacer and the sub photo spacer are respectively located above and corresponding to the first lining section and the second lining section.

The present invention further provides an array substrate, which comprises: a backing plate, a TFT layer arranged on the backing plate, a protective layer covering the backing plate and the TFT layer, a color resist layer arranged on the protective layer, an organic planarization layer set on and covering the color resist layer and the protective layer, and a BPS light-shielding layer arranged on the organic planarization layer;

wherein the BPS light-shielding layer comprises: a black matrix and a main photo spacer and a sub photo spacer arranged on the black matrix, wherein the organic planarization layer is formed with a first recess in an area thereof that corresponds to at least a part of the black matrix and the first recess is filled up with the black matrix;

wherein the color resist layer is formed with a second recess in an area thereof that corresponds to the first recess and the second recess is also filled up with the black matrix;

wherein the TFT layer comprises: a plurality of scan lines that are parallel with and spaced from each other, a plurality of data lines that are parallel with and spaced from each other and are substantially perpendicular to the scan lines, and a plurality of TFTs arranged in an array;

wherein the first recess is formed in a location above the data lines or the scan lines or above both the data lines and the scan lines; and wherein the color resist layer comprises a first lining section and a second lining section, wherein the first lining section has a thickness that is greater than that of the second lining section and the main photo spacer and the sub photo spacer are respectively located above and corresponding to the first lining section and the second lining section.

The efficacy of the present invention is that the present invention provides an array substrate. The array substrate comprises: a backing plate, a TFT layer arranged on the backing plate, a protective layer covering the backing plate and the TFT layer, a color resist layer arranged on the protective layer, an organic planarization layer set on and covering the color resist layer and the protective layer, and a BPS light-shielding layer arranged on the organic planarization layer. The BPS light-shielding layer comprises: a black matrix and a main photo spacer and a sub photo spacer arranged on the black matrix. The organic planarization layer is formed with a first recess in an area thereof that corresponds to at least a part of the black matrix and the first recess is filled up with the black matrix. By forming the first recess in the organic planarization layer and filling the first recess with the black matrix, the extent by which the black matrix projects beyond a pixel area can be reduced to prevent the black matrix from forming a barrier wall between sub-pixels that affects flowability of liquid crystal and to ensure the quality of a liquid crystal boxing process and the displaying performance of a device. The present invention also provides a manufacturing method of an array substrate, which helps ensures flowability of liquid crystal and prevents poor displaying.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
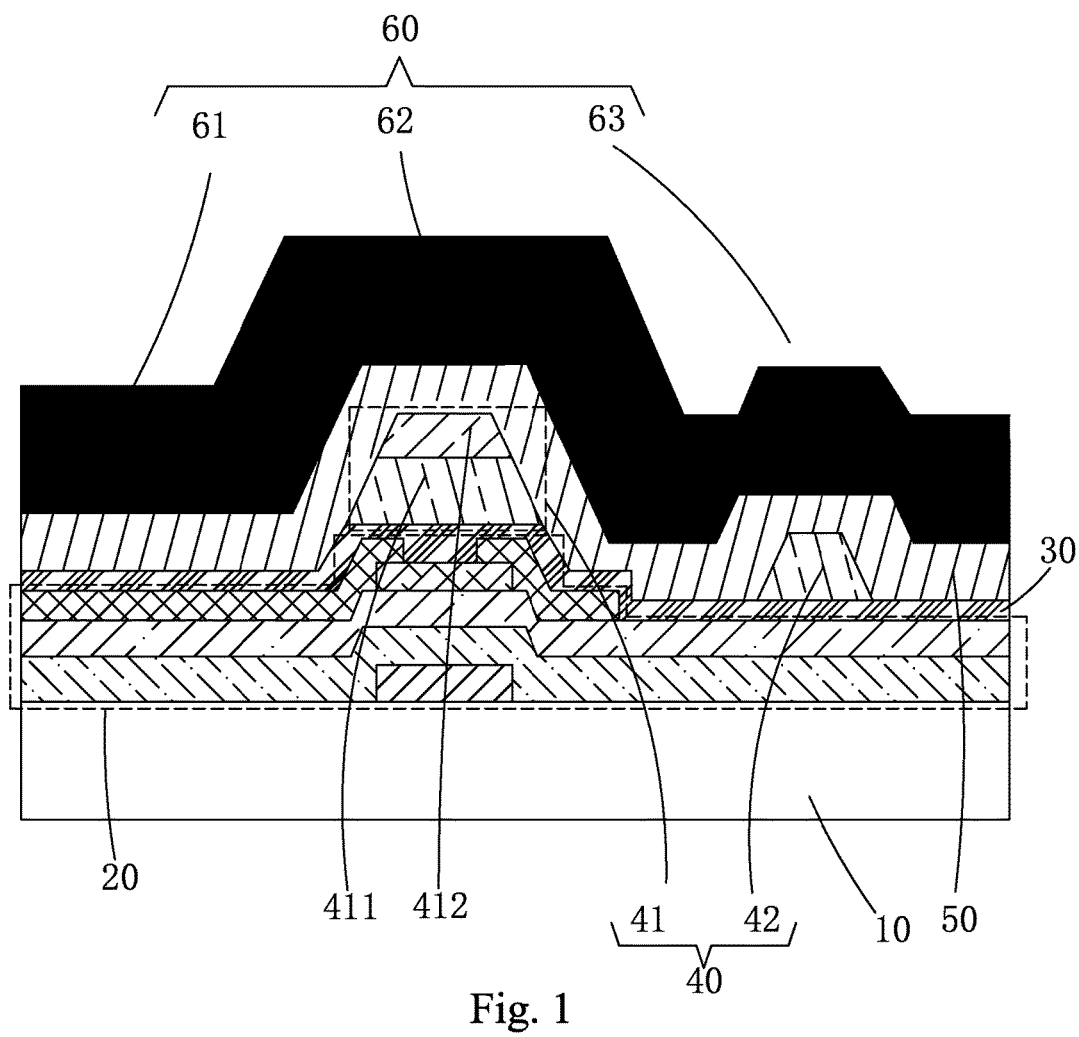
FIG. 1 is a cross-sectional view of a first embodiment of an array substrate according to the present invention, taken along a horizontal line direction in a thin-film transistor (TFT) area.
Figure 2:
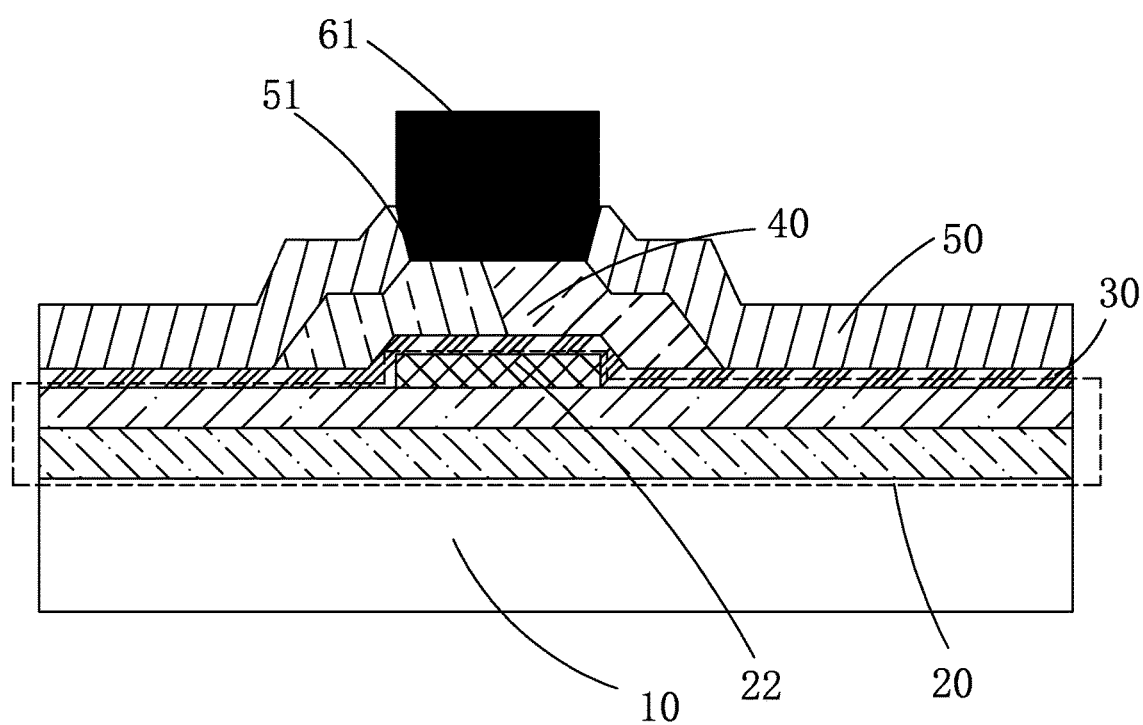
FIG. 2 is a cross-sectional view of the first embodiment of the array substrate according to the present invention, taken along a horizontal direction in a data line area.
Figure 3:
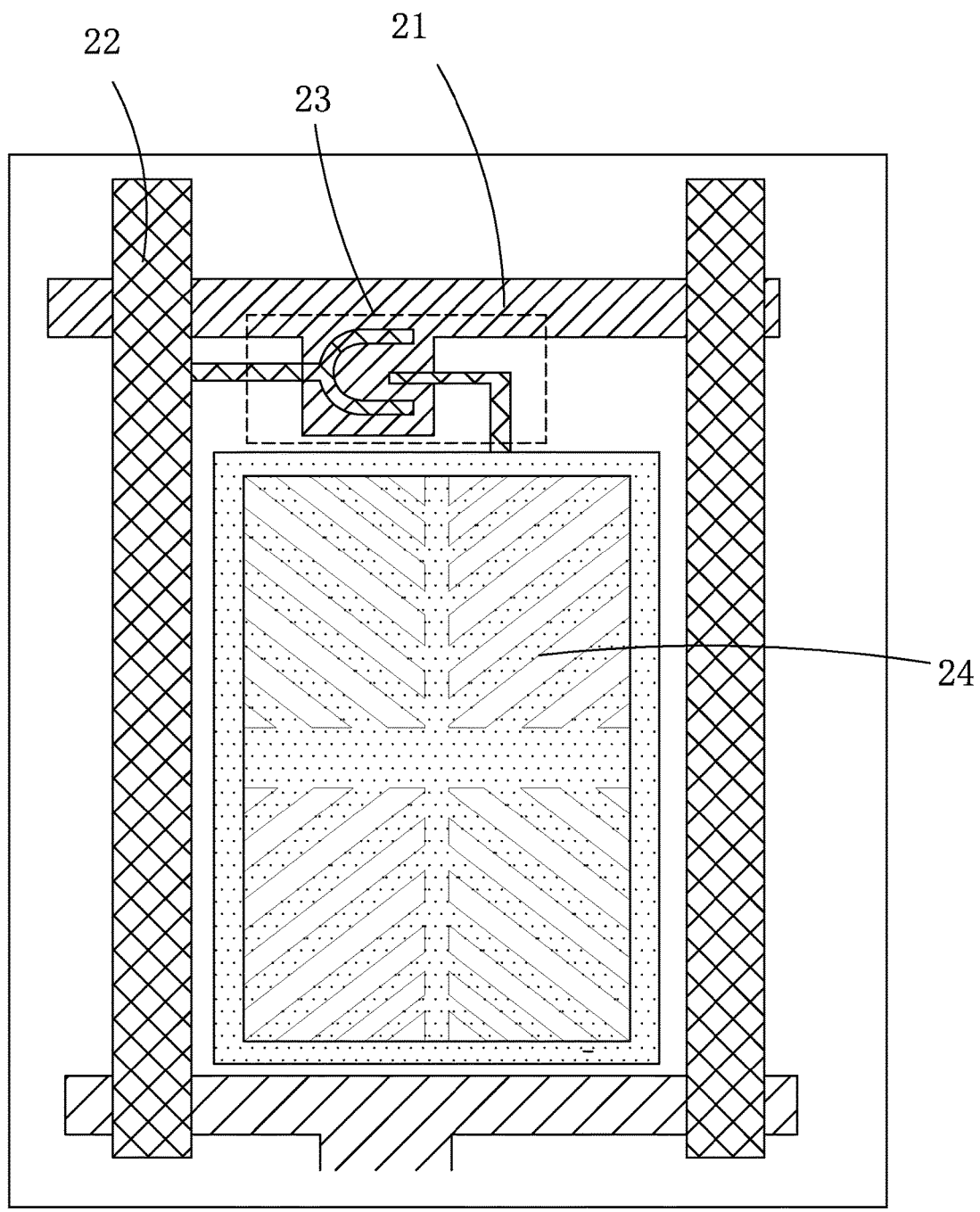
FIG. 3 is a top plan view of the array substrate according to the present invention.

Referring to FIGS. 1-3, the present invention provides, in a first embodiment, an array substrate that comprises: a backing plate 10, a thin-film transistor (TFT) layer 20 arranged on the backing plate 10, a protective layer 30 covering the backing plate 10 and the TFT layer 20, a color resist layer 40 arranged on the protective layer 30, an organic planarization layer 50 set on and covering the color resist layer 40 and the protective layer 30, and a black-photo-spacer (BPS) light-shielding layer 60 arranged on the organic planarization layer 50.

The BPS light-shielding layer 60 comprises: a black matrix 61 and a main photo spacer 62 and a sub photo spacer 63 arranged on the black matrix 61. The organic planarization layer 50 is formed with a first recess 51 in an area thereof that corresponds to at least a part of the black matrix 61 and the first recess 51 is filled up with the black matrix 61.

Specifically, as shown in FIG. 3, the TFT layer 20 comprises: a plurality of scan lines 21 that are parallel with and spaced from each other, a plurality of data lines 22 that are parallel with and spaced from each other and are substantially perpendicular to the scan lines 21, and a plurality of TFTs 23 arranged in an array. A pixel electrode 24 is arranged between the TFT layer 20 and the organic planarization layer 50, and the pixel electrode 24 is electrically connected, via a connection via, with a drain electrode of the TFT 23.

Further, as shown in FIG. 1, in the first embodiment of the present invention, the color resist layer 40 comprises a first lining section 41 and a second lining section 42, wherein the first lining section 41 has a thickness that is greater than that of the second lining section 42. The main photo spacer 62 and the sub photo spacer 63 are respectively located above and corresponding to the first lining section 41 and the second lining section 42. In fabrication, one regular photo mask that possesses two light transmission rates including complete light transmission and complete light blocking is used to pattern the black resist material so that the BPS layer 60 is formed by simply removing a portion of the black resist material other than the black matrix 61, the main photo spacer 62, and the sub photo spacer 63.

Preferably, the main photo spacer 62 and the sub photo spacer 63 have a height difference that is 0.2-1.0 um.

Preferably, the first lining section 41 is located above the TFT 23 and the second lining section 42 is located above the scan line 21.

Preferably, the first lining section 41 is formed of a color resist 411 and a color resist 412, which are adjacent to each other and are of different colors, stacked on each other.

Further, as shown in FIG. 2, in the first embodiment of the present invention, the first recess 51 is formed above the data line 22 and the first recess 51 completely covers the data line 22, so that with the first recess 51 being filled up with the black matrix 61, the black matrix 61 completely shields the data line 22.

Figure 4:
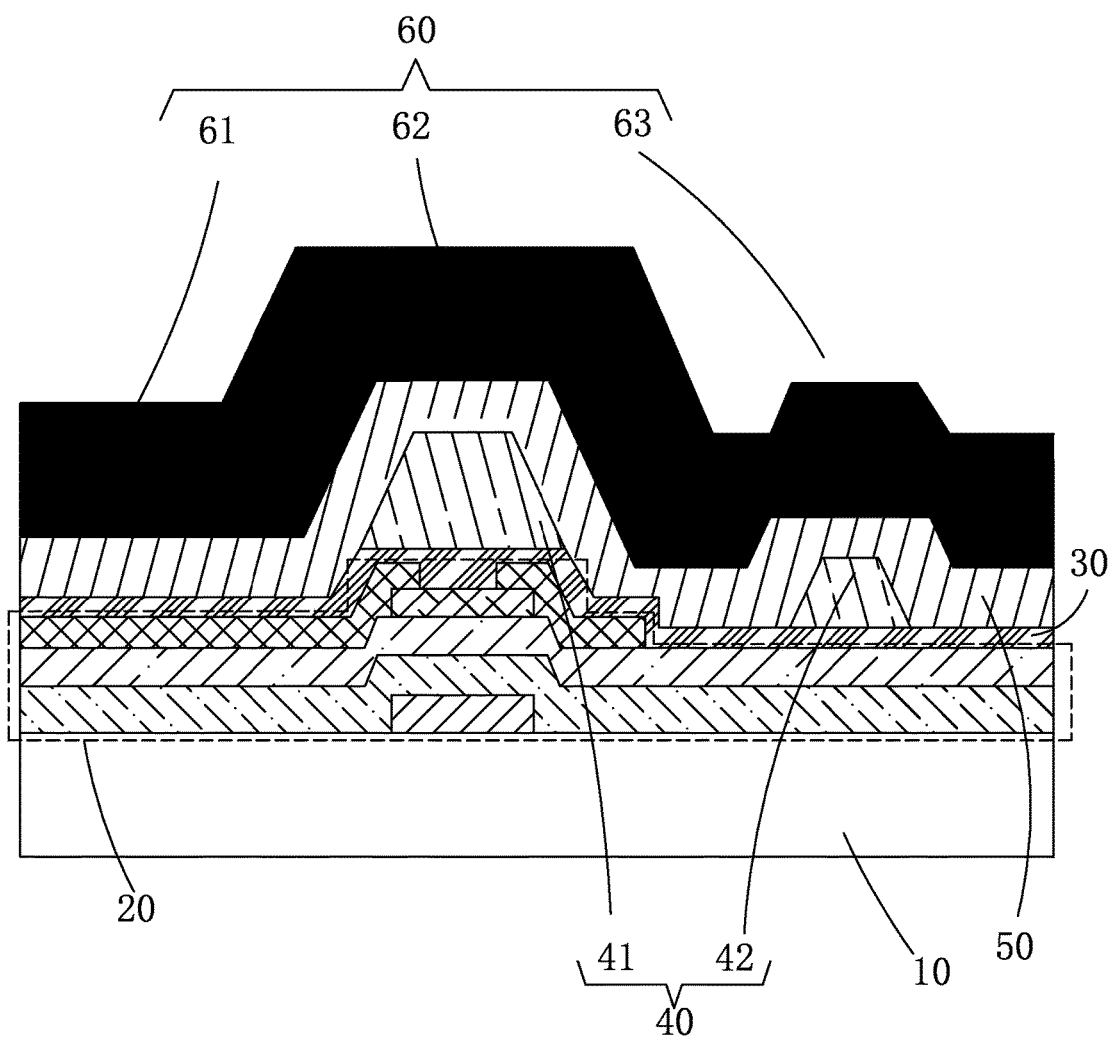
FIG. 4 is a cross-sectional view of a second embodiment of the array substrate according to the present invention, taken along a horizontal line direction in a thin-film transistor (TFT) area.

Specifically, as shown in FIG. 4, in the second embodiment of the present invention, the color resist layer 40 is formed with a second recess 52 in an area thereof that corresponds to the first recess 51 and the second recess 52 is also filled up with the black matrix 61. By forming the second recess 52 in the color resist layer 40, a height of the black matrix 61 can be reduced to help improve flowability of liquid crystal.

Figure 5:
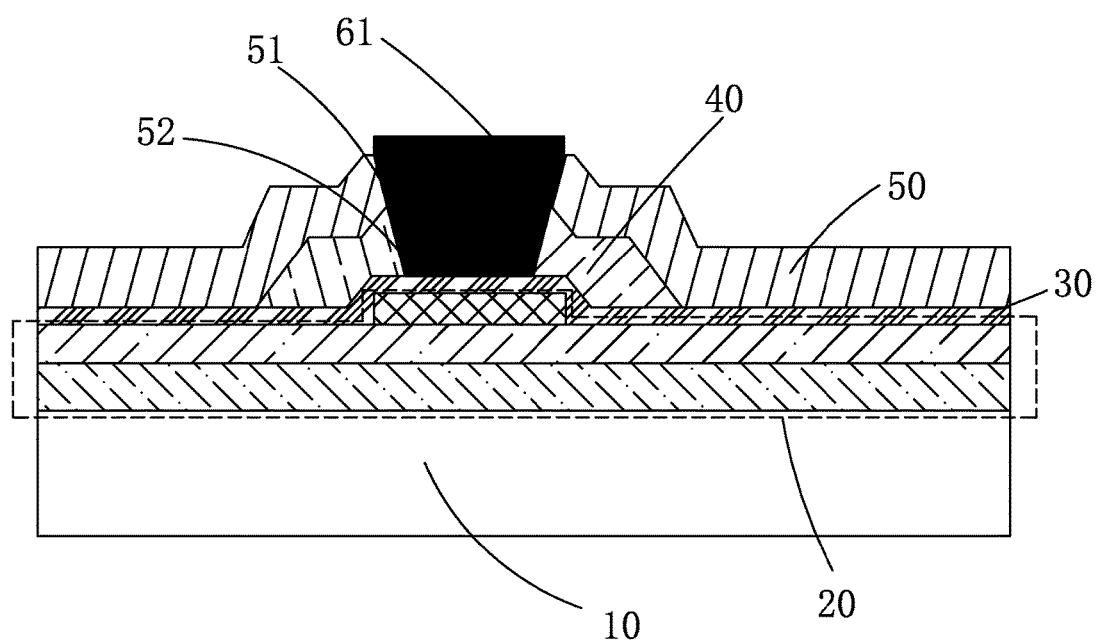
FIG. 5 is a cross-sectional view of the second embodiment of the array substrate according to the present invention, taken along a horizontal direction in a data line area.

Specifically, as shown in FIG. 5, in the second embodiment of the present invention, the first lining section 41 and the second lining section 42 are formed by patterning a color resist of the same color with a multi-tone photo mask, wherein the multi-tone photo mask possesses different light transmission rates at sites thereof respectively corresponding to the first lining section 41 and the second lining section 42 so that the first lining section 41 and the second lining section 42 may have different thicknesses.

It can be appreciated that although in the above embodiments, the first recess 51 is formed at a location above the data line 22, this invention is not so limited. In other embodiments of the present invention, the first recess 51 may be formed at a location above the scan lines 21 or, alternatively, formed at locations above both the data lines 22 and the scan lines 21, provided, actually, the first recess 51 is located under the black matrix 61 to allow the black matrix 61 to sink into the first recess 51 and thus, achieving the purpose of lowering down the height of the black matrix 61.

Figure 6:
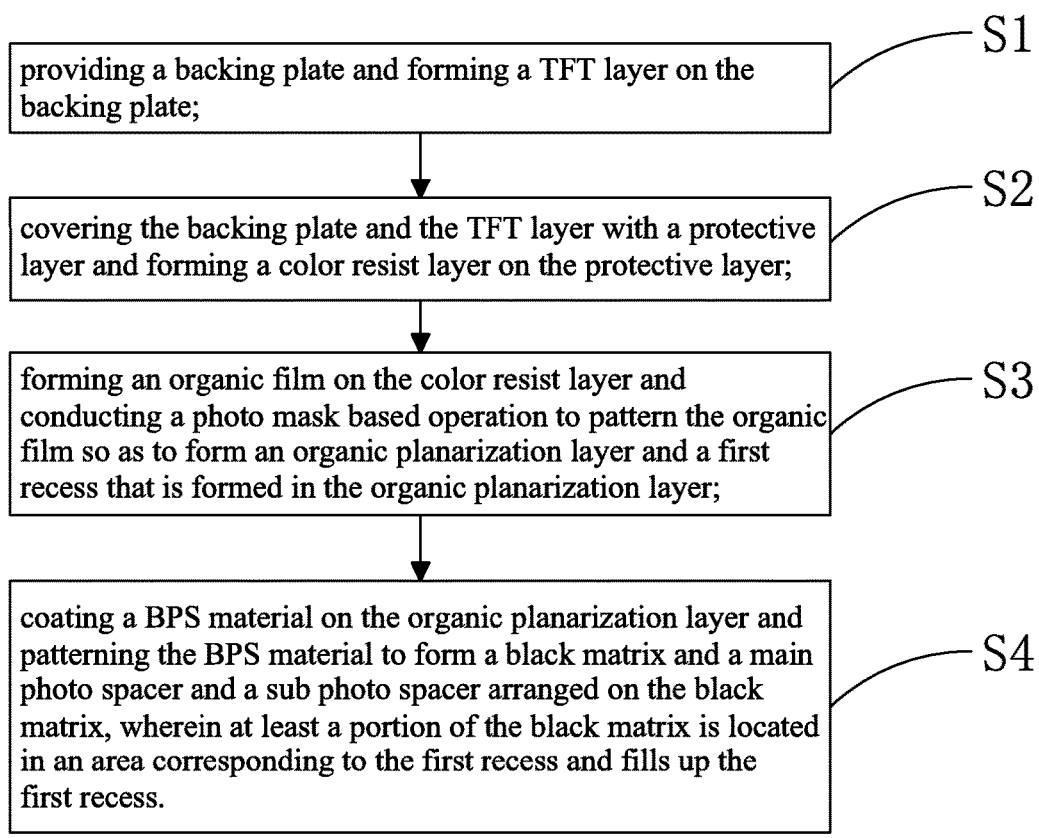
FIG. 6 is a flow chart illustrating a manufacturing method of an array substrate according to the present invention.

Referring to FIG. 6, the present invention provides a manufacturing method of an array substrate, which comprises the following steps:

Step S1: providing a backing plate 10 and forming a TFT layer 20 on the backing plate 10.

Specifically, as shown in FIG. 3, the TFT layer 20 comprises: a plurality of scan lines 21 that are parallel with and spaced from each other, a plurality of data lines 22 that are parallel with and spaced from each other and are substantially perpendicular to the scan lines 21, and a plurality of TFTs 23 arranged in an array.

Further, Step S1 specifically comprises: depositing a first metal layer on the backing plate 10, patterning the first metal layer to form the scan line 21 and a gate electrode of the TFT 23 that is electrically connected with the scan line 21, then depositing a gate insulation layer, then forming an active layer on the gate insulation layer to be located above and correspond to the gate electrode, then forming a second metal layer on the gate insulation layer and the active layer and patterning the second metal layer to form a source electrode and a drain electrode of the TFT 23 that are respectively connected to two ends of the active layer and the data line that is electrically connected with the source electrode.

Step S2: covering the backing plate 10 and the TFT layer 20 with a protective layer 30 and forming a color resist layer 40 on the protective layer 30.

Specifically, the color resist layer 40 comprises red, green, and blue resists.

Step S3: forming an organic film on the color resist layer 40 and patterning the organic film to form an organic planarization layer 50 and a first recess 51 formed in the organic planarization layer 50.

Specifically, Step S3 uses one photo mask based operation to pattern the organic planarization layer 50.

Specifically, the first recess 51 is formed by patterning a portion of the organic film in a corresponding area, meaning the first recess 51 does not expose the protective layer 30, in order to effectively reduce a height of a black matrix 61 in the first recess 51 in a subsequent process. The first recess 51 is formed by patterning the entirety of the organic film in the corresponding area, meaning the first recess 51 exposes the protective layer 30, in order to further reduce the height of the black matrix 61 in the first recess 51 in the subsequent process. Preferably, the first recess 51 is formed by etching the organic film.

Step S4: coating a BPS material on the organic planarization layer 50 and patterning the BPS material to form a black matrix 61 and a main photo spacer 62 and a sub photo spacer 63 arranged on the black matrix 61, wherein at least a portion of the black matrix 61 is located in an area corresponding to the first recess 51 and fills up the first recess 51.

Specifically, as shown in FIG. 1, in the first embodiment of the present invention, the color resist layer 40 comprises a first lining section 41 and a second lining section 42, wherein the first lining section 41 has a thickness that is greater than that of the second lining section 42. The main photo spacer 62 and the sub photo spacer 63 are respectively located above and corresponding to the first lining section 41 and the second lining section 42. In Step S4, one regular photo mask that possesses two light transmission rates including complete light transmission and complete light blocking is used to pattern the black resist material so that the BPS layer 60 is formed by simply removing a portion of the black resist material other than the black matrix 61, the main photo spacer 62, and the sub photo spacer 63.

Preferably, the main photo spacer 62 and the sub photo spacer 63 have a height difference that is 0.2-1.0 um.

Preferably, the first lining section 41 is located above the TFT 23 and the second lining section 42 is located above the scan line 21. Preferably, the first lining section 41 is formed of a color resist 411 and a color resist 412, which are adjacent to each other and are of different colors, stacked on each other.

Further, as shown in FIG. 2, in the first embodiment of the present invention, the first recess 51 is formed above the data line 22 and the first recess 51 completely covers the data line 22, so that with the first recess 51 being filled up with the black matrix 61, the black matrix 61 completely shields the data line 22.

Specifically, as shown in FIG. 4, in the second embodiment of the present invention, the color resist layer 40 is formed with a second recess 52 in an area thereof that corresponds to the first recess 51 and the second recess 52 is also filled up with the black matrix 61. By forming the second recess 52 in the color resist layer 40, a height of the black matrix 61 can be reduced to help improve flowability of liquid crystal.

Specifically, as shown in FIG. 5, in the second embodiment of the present invention, the first lining section 41 and the second lining section 42 are formed by patterning a color resist of the same color with a multi-tone photo mask, wherein the multi-tone photo mask possesses different light transmission rates at sites thereof respectively corresponding to the first lining section 41 and the second lining section 42 so that the first lining section 41 and the second lining section 42 may have different thicknesses.

It can be appreciated that although in the above embodiments, the first recess 51 is formed at a location above the data line 22, this invention is not so limited. In other embodiments of the present invention, the first recess 51 may be formed at a location above the scan lines 21 or, alternatively, formed at locations above both the data lines 22 and the scan lines 21, provided, actually, the first recess 51 is located under the black matrix 61 to allow the black matrix 61 to sink into the first recess 51 and thus, achieving the purpose of lowering down the height of the black matrix 61.

In summary, the present invention provides an array substrate. The array substrate comprises: a backing plate, a TFT layer arranged on the backing plate, a protective layer covering the backing plate and the TFT layer, a color resist layer arranged on the protective layer, an organic planarization layer set on and covering the color resist layer and the protective layer, and a BPS light-shielding layer arranged on the organic planarization layer. The BPS light-shielding layer comprises: a black matrix and a main photo spacer and a sub photo spacer arranged on the black matrix. The organic planarization layer is formed with a first recess in an area thereof that corresponds to at least a part of the black matrix and the first recess is filled up with the black matrix. By forming the first recess in the organic planarization layer and filling the first recess with the black matrix, the extent by which the black matrix projects beyond a pixel area can be reduced to prevent the black matrix from forming a barrier wall between sub-pixels that affects flowability of liquid crystal and to ensure the quality of a liquid crystal boxing process and the displaying performance of a device. The present invention also provides a manufacturing method of an array substrate, which helps ensures flowability of liquid crystal and prevents poor displaying.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. An array substrate, comprising: a backing plate, a thin-film transistor (TFT) layer arranged on the backing plate, a protective layer covering the backing plate and the TFT layer, a color resist layer arranged on the protective layer, an organic planarization layer set on and covering the color resist layer and the protective layer, and a black-photo-spacer (BPS) light-shielding layer arranged on the organic planarization layer;

wherein the BPS light-shielding layer comprises: a black matrix and a main photo spacer and a sub photo spacer arranged on the black matrix, wherein the organic planarization layer is formed with a first recess in an area thereof that corresponds to at least a part of the black matrix and the first recess is filled up with the black matrix, wherein the color resist layer is formed with a second recess in an area thereof that corresponds to the first recess and the second recess is also filled up with the black matrix.

2. A manufacturing method of an array substrate, comprising the following steps:

Step S1: providing a backing plate and forming a thin-film transistor (TFT) layer on the backing plate;

Step S2: covering the backing plate and the TFT layer with a protective layer and forming a color resist layer on the protective layer;

Step S3: forming an organic film on the color resist layer and conducting a photo mask based operation to pattern the organic film so as to form an organic planarization layer and a first recess that is formed in the organic planarization layer; and Step S4: coating a black-photo-spacer (BPS) material on the organic planarization layer and patterning the BPS material to form a black matrix and a main photo spacer and a sub photo spacer arranged on the black matrix, wherein at least a portion of the black matrix is located in an area corresponding to the first recess and fills up the first recess, wherein Step S2 further comprises:

forming a second recess in the color resist layer and in Step S3, the first recess is formed in an area that corresponds to the second recess.

3. An array substrate, comprising: a backing plate, a thin-film transistor (TFT) layer arranged on the backing plate, a protective layer covering the backing plate and the TFT layer, a color resist layer arranged on the protective layer, an organic planarization layer set on and covering the color resist layer and the protective layer, and a black-photo-spacer (BPS) light-shielding layer arranged on the organic planarization layer;

wherein the BPS light-shielding layer comprises: a black matrix and a main photo spacer and a sub photo spacer arranged on the black matrix, wherein the organic planarization layer is formed with a first recess in an area thereof that corresponds to at least a part of the black matrix and the first recess is filled up with the black matrix;

wherein the color resist layer is formed with a second recess in an area thereof that corresponds to the first recess and the second recess is also filled up with the black matrix;

wherein the TFT layer comprises: a plurality of scan lines that are parallel with and spaced from each other, a plurality of data lines that are parallel with and spaced from each other and are substantially perpendicular to the scan lines, and a plurality of TFTs arranged in an array;

wherein the first recess is formed in a location above the data lines or the scan lines or above both the data lines and the scan lines; and wherein the color resist layer comprises a first lining section and a second lining section, wherein the first lining section has a thickness that is greater than that of the second lining section and the main photo spacer and the sub photo spacer are respectively located above and corresponding to the first lining section and the second lining section.

* * * * *